United States Patent [19]

DiMassimo et al.

[11] 4,365,203
[45] Dec. 21, 1982

[54] MULTI-FREQUENCY CLOCK GENERATOR WITH ERROR-FREE FREQUENCY SWITCHING

[75] Inventors: Donald V. DiMassimo; John B. May, both of Liverpool, N.Y.

[73] Assignee: General Electric Company, Schenectady, N.Y.

[21] Appl. No.: 231,698

[22] Filed: Feb. 5, 1981

[51] Int. Cl.³ .................. H03L 7/00; H03K 5/00; H03K 19/007
[52] U.S. Cl. .......................... 328/63; 328/61; 307/219; 307/269; 307/271
[58] Field of Search .................. 328/60, 61, 63; 307/219, 269, 271

[56] References Cited

U.S. PATENT DOCUMENTS

| | | | |
|---|---|---|---|
| 3,350,580 | 10/1967 | Harrison | 307/219 |
| 3,448,387 | 6/1969 | Brandt et al. | 307/271 |
| 4,115,706 | 9/1978 | Yamaguchi | 307/269 |
| 4,229,699 | 10/1980 | Frissell | 328/63 |
| 4,254,475 | 3/1981 | Cooney et al. | 364/900 |
| 4,277,693 | 7/1981 | Hoekman | 307/269 |

OTHER PUBLICATIONS

DiMassimo et al., "Astable and Monostable Oscillators Using RCA COS/MOS Digital Integrated Circuits", Application Note ICAN-6466.

Primary Examiner—John S. Heyman
Attorney, Agent, or Firm—Marvin Snyder; James C. Davis, Jr.

[57] ABSTRACT

A system clock generator includes circuitry for error-free switching of clock frequency. Frequency switching is necessary, for example, when the main power supply fails and to conserve standby battery energy the system is operated at a low clock frequency. Conversely, when the main power source is restored, system clock frequency must be returned to normal. The clock generator and switching circuitry comprise two bistable switch circuits and an RC (resistance-capacitance) oscillator made up of a NAND gate, an inverter, and an RC network. One of the bistable switch circuits includes means for detecting the presence of signals indicating the existence of a condition requiring frequency switchover.

6 Claims, 3 Drawing Figures

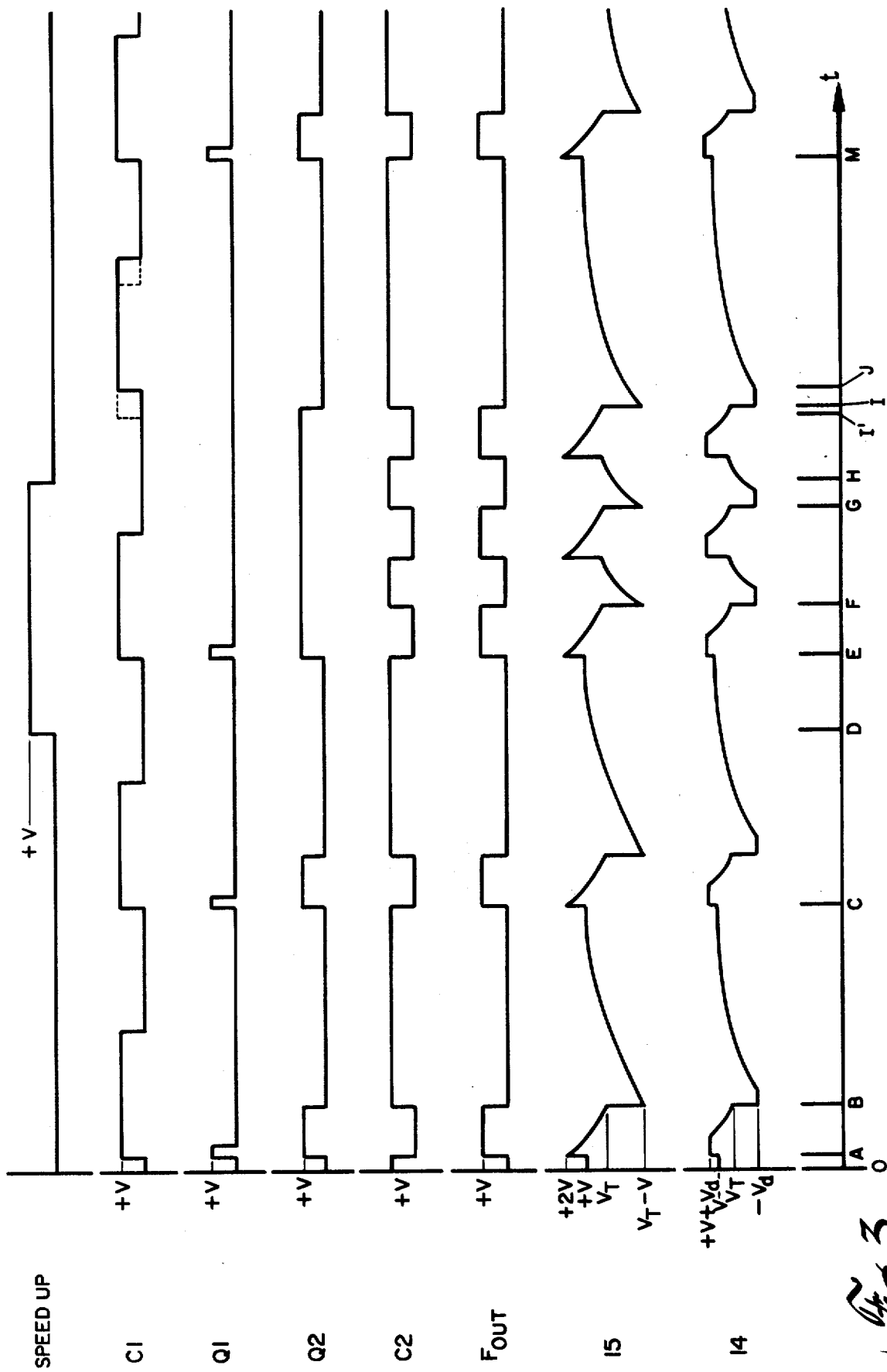

4,365,203

MULTI-FREQUENCY CLOCK GENERATOR WITH ERROR-FREE FREQUENCY SWITCHING

BACKGROUND OF THE INVENTION

This invention relates to system clock generators and, more specifically, to multi-frequency system clock generators with errorfree frequency switching.

In microprocessor based electronic systems and in other electronic systems it is often necessary or desirable to use more than one basic clock frequency. The clock frequency is, generally, the frequency which provides clock signals to a number of digital integrated circuits or other digital circuits. One exemplary situation requiring the use of a multi-frequency clock generator occurs in systems in which the main power source is the AC power mains, and which include critical circuitry that must remain in operation and/or store data in an electronic memory should the main power source fail. In such systems, a standby battery is often provided to supply emergency power to time-keeping circuitry and to preserve full memory storage until the main power is restored. Since it is not unusual for the battery to remain inactivated for extended periods of time (with some loss in stored energy) and since it is impossible to predict the duration of the power outage, it is essential that battery power drain be minimized when the battery is activated to provide emergency power. One of the ways to reduce battery drain is to operate the system at a lower clock frequency.

In the past, switchover from one clock frequency to another has been accomplished by means of monostable multivibrator or resistor/capacitor (RC) delay circuits which are relatively complicated and often unreliable. In operation these circuits frequently cause errors in the form of narrow pulses, which cause major system problems, hard-to-diagnose conditions, and testing constraints.

The present invention provides a low cost, low complexity, multi-frequency system clock generator with error-free frequency switching circuitry. As described more fully hereinafter, the circuit comprises two bistable switch circuits, and an RC oscillator made up of a NAND gate circuit, an inverter, and associated RC time-constant circuitry.

These and other features provided by the present invention will be more fully described in the detailed description of the invention.

SUMMARY OF THE INVENTION

The multi-frequency clock generator and frequency switching circuitry of the present invention employs two bistable switch circuits (dual D flip-flops) and an RC oscillator comprising a NAND gate, an inverter, and an RC time-constant network. In the preferred embodiment of the invention the clock generator provides error-free switching between high and low frequency clock output signals appearing at the output of the inverter. In the high frequency output signal mode, one of two NAND gate inputs is held at a logic high ("high") signal level permitting the RC oscillator to oscillate in an astable mode driving the other NAND gate input high at a frequency determined by the circuit RC time constant. As the two NAND gate inputs are driven high, the logic low ("low") signal level at the NAND gate output is inverted by the inverter to provide a clock output signal. In the low frequency clock output signal mode, the inverter output is controlled by a low frequency clock signal driving one of the dual D flip-flop circuits and which is provided by a conventional square-wave clock generator. Frequency switching is error-free since, as described more fully hereinafter, it cannot occur until after a signal mandating frequency switching is received and is transferred to a flip-flop output, connected to one of the NAND gate inputs, by a positive signal transition in the square-wave clock signal, or a low-to-high signal transition in the output of the NAND gate.

Accordingly, it is an object of the invention to provide a low cost, low complexity, multi-frequency clock signal generator with error-free frequency switching circuitry.

It is another object of the invention to provide a multi-frequency clock signal generator including means for switching the frequency of the output signal when directed by electrical signals external to the clock generator.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

FIG. 3 illustrates voltage/timing diagrams, similar to those of FIG. 2 illustrating circuit operation in an alternate timing sequence.

DETAILED DESCRIPTION OF THE INVENTION

Figure 1:
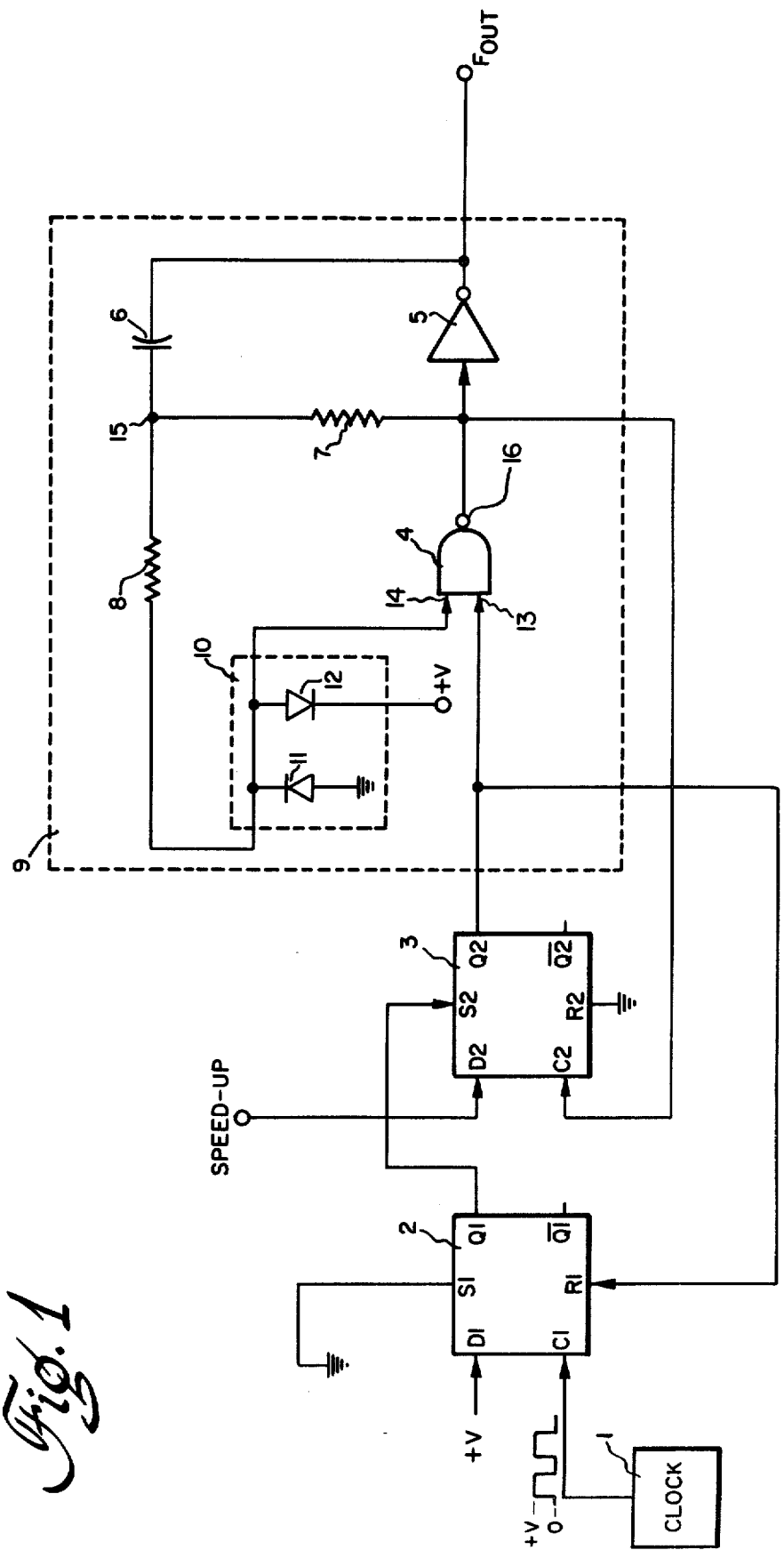
FIG. 1 is a schematic diagram of the multi-frequency clock generator in accordance with the present invention.

FIG. 1 is a schematic illustration of a dual frequency system clock generator circuit in accordance with the preferred embodiment of the present invention. The circuit includes two bistable switch devices 2 and 3 of the type commonly referred to as dual D flip-flops, having their respective outputs Q1 and Q2 connected, respectively, to a set terminal S2 of flip-flop 3 and a reset terminal R1 of flip-flop 2. Flip-flop 2 is driven at its clock input C1 by a low frequency (approximately 1000 Hz) square wave clock signal of peak-to-peak amplitude V provided by a conventional clock signal source 1. Positive transitions (from 0 to +V or "low"-to-"high") in the square wave clock signal cause the voltage level appearing at an input D1 of flip-flop 2 to be transferred to the flip-flop output Q1. A set terminal S1 of flip-flop 2 is grounded and its complements output terminal $\overline{Q1}$ is not used. An input terminal D2 of flip-flop 3 is connected to a source (not shown) of "speed-up" signals illustrated in FIG. 2 which initiate the switching of the frequency of the clock generator output signal $F_{out}$ appearing at the output of an inverter 5. A complements output terminal $\overline{Q2}$ of flip-flop 3 is not used, while reset terminal R2 of flip-flop 3 is grounded.

An RC oscillator 9, shown in FIG. 1, comprises a NAND gate circuit 4 having one of its input terminals 13 connected to the output Q2 of flip-flop 3 and having its output 16 connected to the input of inverter 5 and to a clock input C2 of flip-flop 3. The output of the NAND gate is also coupled through series resistors 7 and 8 to its other input terminal 14 through a diode protection circuit 10. A capacitor 6 couples the output of inverter 5 to the common connection of series resistors 7 and 8, and forms therewith an RC timing circuit.

In the preferred embodiment, bistable switch circuits 2 and 3 each comprise a Series 4000, CMOS, dual D flip-flop identified by the standard industry designation 4013 and available from RCA. The NAND gate circuit is a similar device identified by the designation 4011. The use of the above-identified devices is merely exemplary, and other devices performing similar functions are suitable for use in the inventive circuit.

NAND gate protection circuit 10 is fabricated and packaged integrally with the circuitry of some NAND gate devices, such as the 4011 device identified above; however, for clarity of description and explanation of the operation of the clock generator, the diode protective circuit 10 is shown separately from the circuitry of the NAND gate 4. Diode protection circuit 10 comprises diodes 11 and 12 having their cathode and anode, respectively, connected to input terminal 14 of NAND gate 4, while the anode of diode 11 is grounded and the cathode of diode 12 is biased at a positive potential V. It is to be understood, however, that the inventive circuit is capable of functioning with a NAND gate device which does not include such protective circuitry.

It will be assumed for the purpose of describing circuit operation that normally a high frequency (approximately 1 MHz) output signal $F_{out}$ is provided at the output of the inverter 5. In this mode, the output Q2 of flip-flop 3 is high, due to the speed-up signal on input D2 being high, thereby also holding the input 13 of NAND gate 4 high. The RC oscillator 9 oscillates in a free-running astable mode, periodically driving NAND gate input 14 high. The coincidence of high signal levels at both input terminals of the NAND gate 4 produces a low signal at its output. (The output of a NAND gate is logic 0 (low) only if all inputs are logic 1 (high); it is logic 1 if any input is logic 0.) However, when the output of the NAND gate is low, the output $F_{out}$ of inverter 5 is high. The frequency of the $F_{out}$ signal depends on the time constant of the RC oscillator determined by the component values of resistors 7, 8 and the capacitor 6.

If a low frequency output signal $F_{out}$ is required (as in the case of failure of the main power supply), the speed-up signal to input D2 of flip-flop 3 is held low. In this mode, the frequency of the $F_{out}$ signal is controlled by the clock signal from clock 1. At each rising edge of the clock signal occurring at the clock input C1, the Q2 output of flip-flop 3 is driven high, allowing astable oscillation to occur at the NAND gate output. However, as the NAND gate output changes from a low to high signal level, a similar transition occurs at the clock C2 input of the flip-flop 3 causing the low speed-up signal to appear at the output Q2, thereby interrupting the oscillations. This process is repeated with each rising clock edge occurring at the input C1 so that the frequency of the $F_{out}$ signal is in synchronism with the clock signal provided by clock 1.

Figure 2:
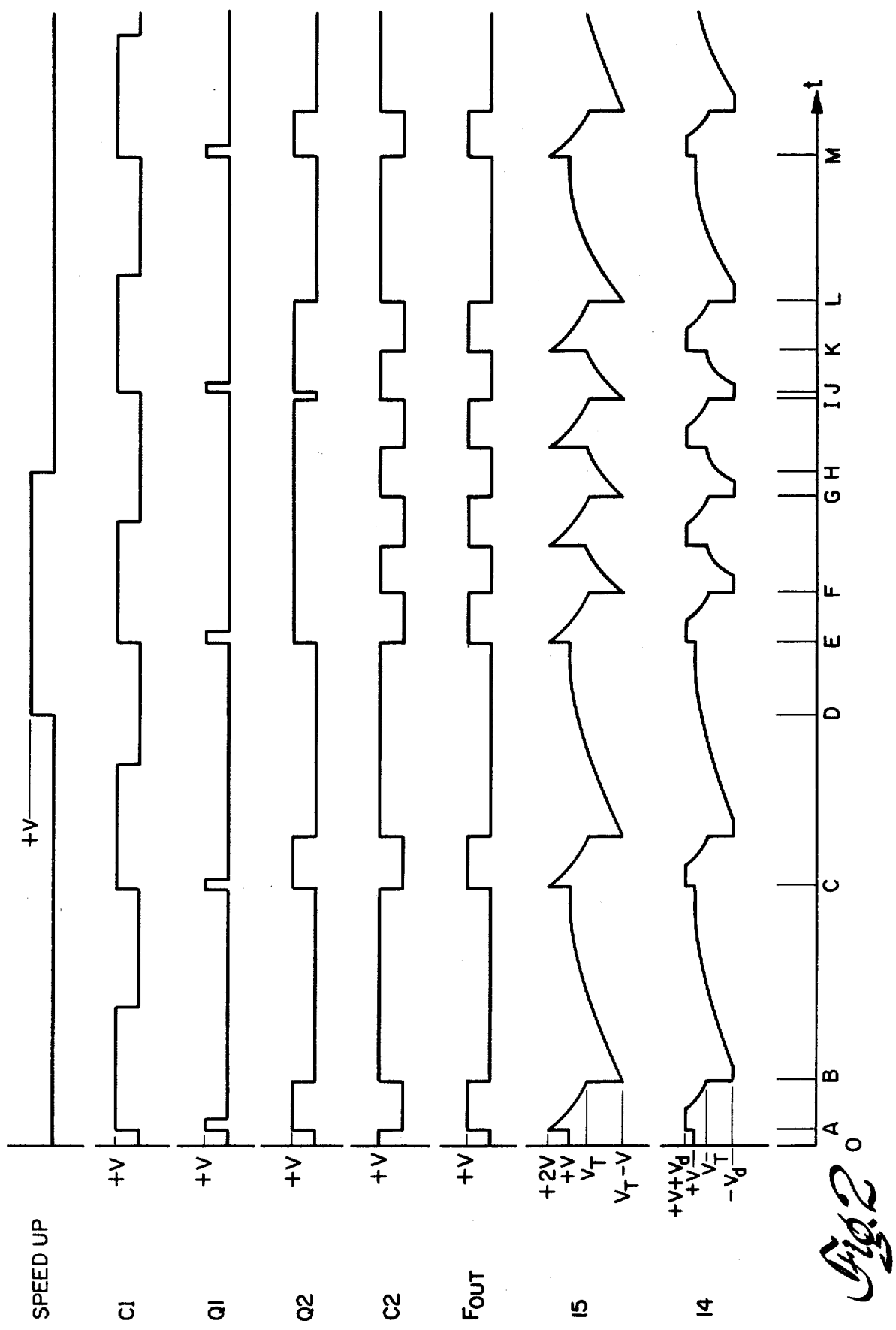
FIG. 2 illustrates voltage/timing diagrams which, when considered with the schematic diagram of FIG. 1, are helpful in understanding the principles of operation of the invention.

The detailed operation of the clock generator schematically illustrated in FIG. 1 can be best understood if reference is made to the voltage/timing diagrams depicted in FIG. 2. The waveforms illustrate steady-state operating conditions. The conditions at time 0 shown in the time axis of FIG. 2 are those associated with the low frequency mode of operation in which the frequency of the output signal $F_{out}$ provided by the inverter 5 is low. Accordingly, at this time, various initial circuit voltage levels, as indicated on the vertical axis of FIG. 2, are present at circuit points and designated in FIG. 2 by the same reference numerals as in FIG. 1. Thus, flip-flop outputs Q1 and Q2, clock input C1, the speed-up signal and the $F_{out}$ signal are low (0V), while NAND gate output 16, NAND gate input 14, and the common point 15 between resistors 7 and 8 are high (+V).

At a time A, indicated on the time axis of FIG. 2, the rising edge of the clock signal provided by clock 1 occurs at clock input terminal C1 of flip-flop 2, causing the +V voltage signal at terminal D1 thereof to appear at terminal Q1 of flip-flop 2 and terminal S2 of flip-flop 3, thereby setting terminal Q2 high. The high signal at Q2 drives input 13 of the NAND gate 4 high and through reset terminal R1 of flip-flop 2, forces Q1 back low until a succeeding rising clock signal edge forces it high again.

Since the input 14 of the NAND gate is high at time A, due to the initial circuit conditions existing at time 0, the signal at the NAND gate output 16 will become low at time A. The low gate output signal is inverted by the inverter 5, producing a clock generator output signal $F_{out}$ as illustrated in FIG. 2. As the output of the inverter 5 is thus forced to +V (high) volts, the voltage across the capacitor cannot change instantaneously, so that the common point 15 between resistors 7 and 8, originally at +V volts, now must be +2V, biasing diode 12 into conduction.

The conducting diode 12 clamps the input 14 of the NAND gate at a potential $(+V + V_d)$, $V_d$ being the forward voltage drop across diode 12 (typically 0.6V for a silicon device). The capacitor 6 discharges through resistors 7 and 8 until the voltage at junction 15 equals $(+V + Vd)$ at which time the diode 12 is biased into nonconduction and current ceases to flow through resistor 8. The capacitor continues to discharge through resistor 7 until a time B when the voltage at the gate input 14, which follows the voltage at point 15, reaches a value $V_T$, the switching voltage level of the NAND gate. At time B the output of the NAND gate goes high, since the input 14 is no longer high, causing the output $F_{out}$ of inverter 5 to go low. At this time, capacitor 6 has $(V - V_T)$ volts across it, point 15 is at $(V_T - V)$ volts, and diode 11 is biased into conduction clamping the gate input 14 terminal at $-V_d$. When the NAND gate output goes high, (at time B), an abrupt rise in voltage appears at the clock input C2 so that the low speed-up signal at the input D2 reappears at output Q2 and the input 13 of the NAND gate. However, this has no effect on the gate output which will remain high until capacitor 6 charges to at least the gate transition voltage $V_T$ thereby also forcing gate input 14 to a voltage $V_T$ (high). The succeeding positive edge of the square wave signal from clock source 1 appears at the input C1 at a time C, forcing Q2 and gate input 13 high, allowing the oscillator 9 to oscillate until the NAND gate output (and clock input C2) switches from low to high, reasserting the low speed-up signal at Q2.

The clock generator continues to provide a low frequency $F_{out}$ signal in the manner described until a time D. At this time the speed-up signal at the terminal D2 goes high indicating, for example, that main power has been restored and that the $F_{out}$ signal be returned to its normal high frequency level.

Despite the fact that the speed-up signal has risen to +V volts, the state of the output Q2 of flip-flop 3 cannot change until a positive voltage transition occurs at its clock input terminal C2 or a positive clock signal edge occurs at clock input C1. At a time E, a positive edge of the clock signal from the clock 1 sets Q2 high. However, circuit operation continues as previously described, until time F when the NAND gate output 16 switches from low to high allowing the high speed-up signal to be asserted at output Q2. Output Q2 will remain high after the speed-up signal reverts to low, and Q2 is returned to low by a low-to-high signal transition at the NAND gate output 16 and hence at the clock input C2. A positive signal transition of the clock signal C1 at this time can only drive Q2 high. Therefore, while Q2 is high, it can have no effect on the NAND gate output signal, which now depends on the status of the gate input 14 which is driven high at a frequency dependent on the RC time constant of oscillator 9. Accordingly, as indicated by the waveforms between times F and H, the frequency of the clock generator's output signal $F_{out}$ is high.

Although the speed-up signal voltage reverts to low at time H, the oscillator provides a high frequency output signal, until time I when the NAND gate output voltage switches from low to high and the low speed-up signal voltage is asserted at Q2. Once the low speed-up signal voltage is asserted at Q2, circuit operation reverts to the low frequency mode at time M following a transition period between times J and M. The transition period is required because when the clock signal provided by the clock 1 at time J sets Q2 high, Q2 can have no effect on the NAND gate output. The NAND gate output is high (due to NAND gate input 14 being low) and will remain so until the charge on the capacitor 6 rises to at least $V_T$ (the NAND gate transition voltage) at time K. At time K both inputs to the NAND gate are high, switching the NAND gate output to low. At time L the capacitor has discharged and the voltage on the NAND gate input 14 has decreased below $V_T$, switching the NAND gate output from low to high. The NAND gate output going from low to high at clock input C2 causes the low voltage speed-up signal to be reasserted at Q2. The output Q2 must remain low until a succeeding clock edge at C1, time M, drives it high permitting the circuit to resume low speed operation under conditions similar to those existing at time A.

For the discussion above, it has been assumed that voltage at gate input 14 has decreased to $V_T$ at a time I just prior to a time J when the positive voltage edge occurred at C1 so that the NAND gate output is high. If the positive voltage edge at clock input C1 had occurred at a time I' prior to time I, as depicted in FIG. 3 by the dotted lines, there would have been no effect on Q2 which is already high. The Q2 waveform proceeds as illustrated until time I when the NAND gate input 14 goes low, causing the NAND gate output to switch from low to high thereby permitting the low voltage speed-up signal to appear at Q2 driving Q2 low. Q2 must remain low until time M when the succeeding positive clock edge occurs at C1 again driving Q2 high so that the output of the NAND gate depends on the state of input 14. Since Q2 must remain low from time I to time M under these circumstances, the output of the NAND gate must remain high so that the $F_{out}$ signal at the output of inverter 5 is low during this time period. During this interval the capacitor 6 has charged to +V (high). Therefore, when at time M a positive clock edge occurs at C1, operation in the low frequency mode proceeds in a manner similar to that at time A, which has been described herein.

From the foregoing, the principle of free frequency switching may be appreciated by observing in FIG. 2 that whenever there is a low-to-high signal transition in NAND gate output 16, point 15 and the NAND gate input 14 are forced low by the voltage on capacitor 6. NAND gate input 14 must remain low for a time proportional to the resistor 7-capacitor 6 time constant (i.e., until capacitor 6 recharges). The low-to-high signal transition at the NAND gate output 16 produces a similar transition at the clock input C2, permitting the then current logic level of the speed-up signal to appear at the output Q2 and at the NAND gate input 13. However, because NAND gate input 14 must remain low for approximately one RC time constant, the fact that output Q2 has gone low or high (depending on the state of the speed-up signal) has no effect on the NAND gate output during the RC time constant period. Therefore, since the speed-up signal cannot appear at output Q2 until a low-to-high signal transition occurs at the NAND gate output and because once the speed-up signal appears at Q2 there can be no effect on the NAND gate output until at least one RC time constant elapses, the NAND gate output is precluded from switching to one state and immediately thereafter changing to the opposite state.

Accordingly, it may be appreciated that the present invention provides a low cost, low complexity, multi-frequency clock signal generator with circuitry to provide error-free clock frequency switching as directed by electrical signals external to the clock generator.

While the invention has been described with reference to particular embodiments and examples, other modifications and variations will occur to those skilled in the art in view of the above teachings. Accordingly, it should be understood that within the scope of the appended claims, the invention may be practiced otherwise than is specifically described.

The invention claimed is:

1. A dual frequency clock generator selectively providing output clock signals at first and second frequencies, comprising:

a source of input clock signals;

a first bistable switching circuit including an input and an output, a reset means for establishing a predetermined logic state at the circuit output, and clock input means coupled to said source of input clock signals for reproducing at the circuit output the logic level on the circuit input upon the occurrence of each positive voltage transition of said input clock signal;

a second bistable switching circuit substantially identical to said first circuit further including set means coupled to the output of said first circuit for setting the output of said second circuit to the logic level on the output of said first circuit, the output of said second circuit also being coupled to said reset means of said circuit, and the input of said second circuit being provided with a frequency select signal for selecting said first or second frequencies; and an RC oscillator coupled to the output of said second circuit, said RC oscillator including means coupled to the clock input means of said second circuit for reproducing at the output of said second circuit said frequency select signal in response to which said clock generator produces an output clock signal at said first or second frequency.

2. The clock generator of claim 1 wherein each of said first and second bistable switching circuits comprises a bistable dual D flip-flop.

3. The clock generator of claim 1 wherein said RC oscillator comprises:
an inverter;
a NAND gate having its output coupled to the input of said inverter and to the clock input means of said second circuit, said NAND gate having a first input coupled to the output of said second circuit said NAND gate also having a predetermined transition voltage; and
a timing circuit coupling the respective outputs of said NAND gate and said inverter to a second input of said NAND gate.

4. The clock generator circuit of claim 3 wherein said timing circuit comprises at least a pair of series-connected resistors coupling the output of said NAND gate to the second input of said NAND gate, and a capacitor coupling the output of said inverter to the common point of said series-connected resistors.

5. The clock generator of claim 4 wherein said first frequency comprises a low frequency equal to the frequency of said input clock signals and wherein said second frequency comprises a frequency higher than said first frequency.

6. The clock generator of claim 5 wherein said series-connected resistors and said capacitor are selected so that the voltage on the second input of said NAND gate increases to at least the NAND gate transition voltage prior to the occurrence of each of said input clock signals, producing said output clock signals at said first frequency in synchronism with said input clock signals, and wherein said second output clock frequency is determined by the selected values of said resistors and said capacitor.

* * * * *